United States Patent [19]

Norris

[11] Patent Number: 5,313,154
[45] Date of Patent: May 17, 1994

[54] APPARATUS FOR DETECTING A FREQUENCY DEVIATION BETWEEN TWO FREQUENCY SOURCES

[75] Inventor: Joseph P. Norris, Mount Laurel, N.J.
[73] Assignee: Honeywell Inc., Minneapolis, Minn.
[21] Appl. No.: 967,356
[22] Filed: Oct. 28, 1992
[51] Int. Cl.[5] .................................. H03D 13/00
[52] U.S. Cl. ..................... 324/76.48; 324/76.41; 328/133; 328/134; 328/141; 377/39
[58] Field of Search ............. 307/525, 526, 528; 328/141, 133, 134; 377/39; 324/76.48, 76.47, 76.41, 76.62

[56] References Cited

U.S. PATENT DOCUMENTS 4,683,437 7/1987 Javeri .......................... 307/525
4,777,447 10/1988 Mueller ...................... 307/525

Primary Examiner—Kenneth A. Wieder
Assistant Examiner—Jose M. Solis
Attorney, Agent, or Firm—Arthur A. Sapelli; Ronald C. Champion; William Udseth

[57] ABSTRACT

The apparatus detects a difference of frequency between a first signal having a first frequency and a second signal having a second frequency, the first and second signals being digital signals. A phase shifter shifts the first signal such that the first signal and the shifted first signal are sufficiently out of phase to keep the rising and falling edges of the two signals from occurring at the same time thereby avoiding subsequent simultaneous triggering conditions and jitter conditions between the first and second signal. A first gate samples the second signal by the shifted first signal to output a first sampled signal. A second gate samples the second signal by the first signal to output a second sampled signal. A sample gate samples the first sampled signal and the second sampled signal to generate a difference signal, the difference signal containing a difference value of the frequency difference between the first and second signal.

5 Claims, 4 Drawing Sheets

APPARATUS FOR DETECTING A FREQUENCY DEVIATION BETWEEN TWO FREQUENCY SOURCES

BACKGROUND OF THE INVENTION

This invention relates to a detector apparatus, and more particularly, to an apparatus for detecting the difference in frequency between the frequency of two electrical signals being supplied by two different frequency sources.

In previous frequency deviation circuits, a single D-type flip flop is used to generate a signal indicative of the difference between the frequencies of two signals, a first signal being applied to a D input of the D-type flip flop, and a second signal being applied to the clock input of the D-type flip flop. The frequency of the first signal is $F_1$ and the frequency of the second signal is $F_2$, the output of the single type flip flop being $F_1 - F_2$. This relatively simple circuit is, however, very susceptible to jitter between the two frequencies $F_1$ and $F_2$ and can exhibit metastable conditions when the two single are in phase.

The detection circuit of the present invention outputs a signal indicative of the difference between the two signals ($F_1 - F_2$), and is an improvement over the single D-type flip flop in that it is not susceptible to jitter between the edges of the two input signals $F_1$ and $F_2$. Further, potential metastable conditions are eliminated.

Thus there is provided by the present invention a detector circuit for detecting the differences of frequency between two signals and is not susceptible to jitter between the two signals. The two signals of the preferred embodiment are digital signals.

SUMMARY OF THE INVENTION

Therefore there is provided by the invention, a reliable detector type circuit for detecting a difference in frequency between the frequencies of two electrical signals each being supplied from a different source which is not susceptible to jitter. The apparatus detects a difference of frequency between a first signal having a first frequency and a second signal having a second frequency, the first signal and the second signal being digital signals. The apparatus comprises a phase shifter which shifts the first signal a predetermined quantity phase-wise such that the first signal and the shifted first singular sufficiently out of phase with each other wherein the rising and falling edges of each of the first signal and the shifted first signal do not occur at essentially the same time thereby avoiding subsequent simultaneous triggering conditions and jitter conditions between the first and second signals. A first gate has first and second input terminals, the first input terminal adapted to receive the second signal and the second input terminal coupled to the phase shifter to receive the shifted first signal. The first gate samples the second signal by the shifted first signal at predetermined times to output a first sampled signal. A second gate has first and second input terminals, the first input terminal of the second gate adapted to receive the second signal and the second input terminal of the second gate adapted to receive the first signal. The second gate samples the second signal by the first signal at predetermined times to output a second sampled signal. A sample gate, has first and second input terminals, the first input terminal of the sample gate being coupled to the second gate to receive the second sampled signal and the second input terminal of the sample gate being coupled to the first gate to receive the first sampled signal. The sample gate samples the first sampled signal and the second sampled signal to generate a difference signal, the difference signal containing a difference value of the frequency difference between the first signal and the second signal.

Accordingly, it is an object of the present invention to provide a detector circuit.

It is another object of the present invention to provide a detector circuit for detecting a frequency deviation between two electrical signals being supplied by two different frequency sources to output a signal indicating the difference between the two frequencies.

It is still another object of the present invention to provide an apparatus for detecting a frequency deviation between the frequency of two electrical signals being supplied by two different frequency sources and is not susceptible to jitter between the frequencies.

These and other objects of the present invention will become more apparent when taken in conjunction with the following description and drawings, wherein like characters indicate like parts, and which drawings form a part of the present application.

DETAILED DESCRIPTION

Figure 1:
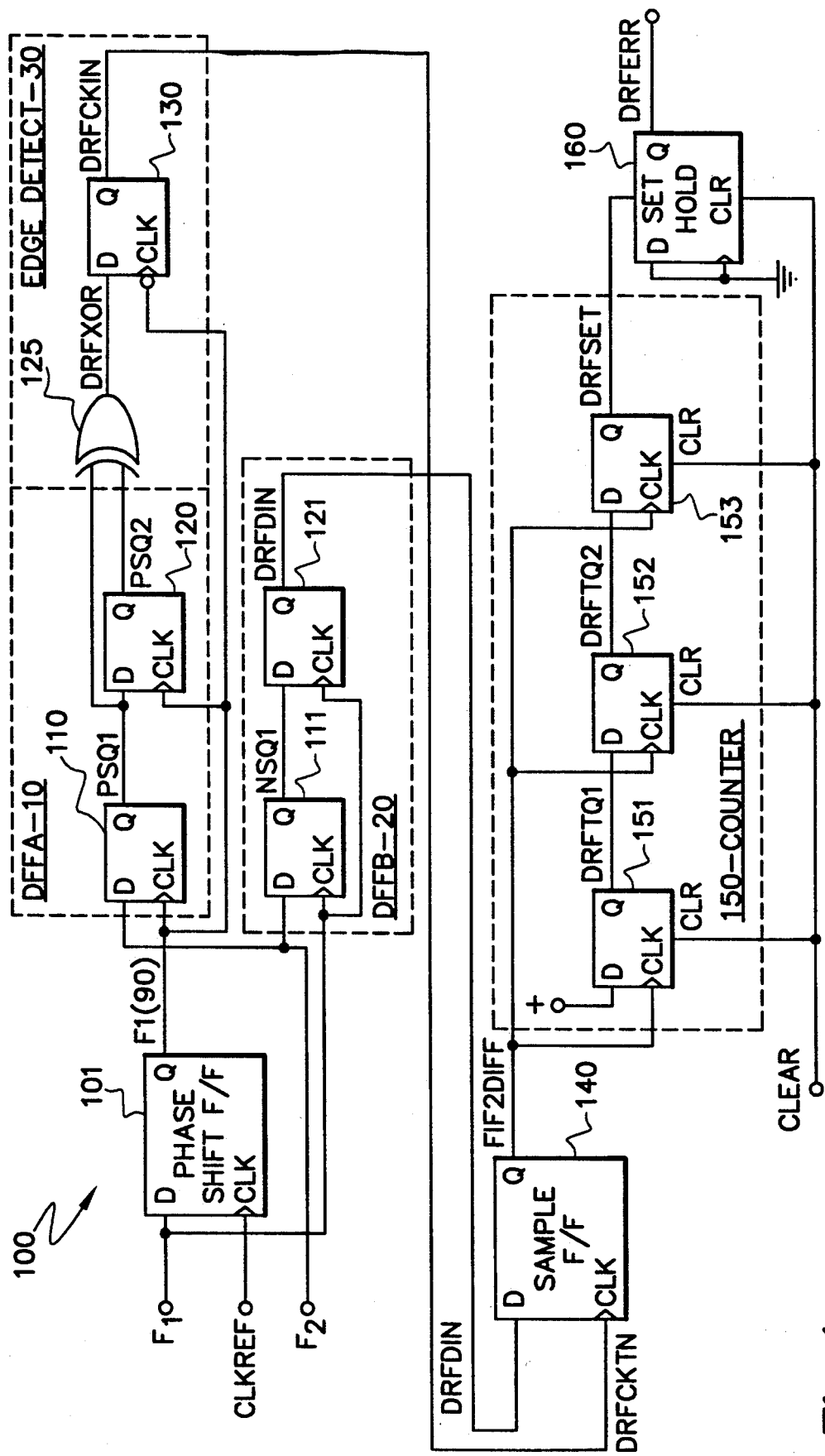
FIG. 1 shows a logic block diagram of the apparatus of the present invention.

Referring to FIG. 1, there is shown a logic diagram of the detector apparatus of the preferred embodiment of the present invention. The first input signal, having a frequency $F_1$, and a second input signal, having a frequency $F_2$, are supplied to the apparatus 100 of the present invention. The frequency of the respective input signals is approximately equal. The first input signal (or more simply first signal) $F_1$ is inputted to a D-type flip flop (F/F), Phase shift F/F, 101, the output of the Phase shift F/F 101 being a signal $F_1$ (90) which is shifted 90° in phase from the first input signal $F_1$. The CLK input to Phase shift F/F 101 is a reference clock frequency (CLKREF) to two times the frequency of $F_1$. It will be recognized by one skilled in the art that the 90° shift is optional and that other degrees of phase shifting can be used. Further, it will also be recognized that although the preferred embodiment utilizes a D-type flip flop for pluse shifting other devices well known to those skilled in the art can be utilized for implementing phase shifting, such as delay lines.

Two double rank flip flops DFFA-10 and DFFB-20 are included. DFFA-10 comprises a first D-type flip flop 110 and a second D-type flip flop 120. DFFB-20 comprises a first D-type flip flop 111 and a second D-type flip flop 121. The first D-type flip flop 110 of DFFA-10 is clocked by the F1 (90) signal and the first D-type flip flop 111 of DFFB-20 is clocked by the F1 signal. Both the first D-type flip flop 110 DFFA-10 and the first D-type flip flop 111 DFFB-20 have the data (D) terminals connected to receive the second input signal F2. The second D-type flip flop 120 of DFFA-10 is coupled to the first D-type flip flop 110 in a standard double rank flip flop arrangement, and the second D-type flip flop 121 of DFFB-20 is coupled to the first D-type flip flop 111 in a standard double rank flip flop arrangement. The double rank arrangement is included in the preferred embodiment of the present invention to avoid metastable conditions.

The output of the first D-type flip flop-110 is a signal PSQ1 and the output of the second D-type flip flop 120 is a signal PSQ2. Both the PSQ1 and PSQ2 signals are inputted to an edge detector circuit 30 for detecting a rising edge and a falling edge between the F1 (90) and the F2 signal, thereby outputting a signal having a clean edge with no metastability, the signal indicating the difference between F1 (90) and the second input signal F2. The edge detect circuit 30 comprises a XOR gate 125 having the PSQ1 and PSQ2 signals as the inputs. The output signal of the XOR gate DRFXOR is inputted to D-type flip flop 130 which is clocked by the inverse F1 (90) signal. The D-type flip flop 130 is included in the edge detect circuit 30 for insuring a clean, sharp rising and falling edge signal, the output signal being DRFCKIN.

The output of the edge detect circuit 30 DRFCKIN is inputted to a clock input of a sample D-type flip flop 140. The data input of the sample D-type flip flop 140 is connected to DFFB-20, the input data signal being DRFDIN which is the output of the second D-type flip flop 121 of DFFB-20. The output of the sample flip flop 140 is a signal C2MAX which is a signal of (F1−F2) i.e., a signal indicating the difference between the frequencies of the first input signals F1 and second input signal F2.

The F1F2DIFF signal, the difference signal between F1 and F2 is inputted to a counter 150. The counter 150 counts the number of transitions in the difference signal, the number of transition being indicative of the frequency difference between the first and second signal. If the difference exceeds a predetermined number, an alarm is outputted.

The counter 150 in the preferred embodiment of the present invention comprises three D-type flip flops 151, 152, 153, each being clocked by the different signal F1F2DIFF. In the preferred embodiment of the present invention when the count exceeds three, for a predetermined period, in the preferred embodiment the predetermined period being one millisecond, the error set signal DRFSET is outputted to a flip flop 160 which holds the error conditions and outputs the error signal DRFERR. Each flip flop of the counter and the hold flip flop 160 is reset every one millisecond by the CLEAR signal. The one millisecond time frame and the count of three is indicative of an absolute frequency deviation between the first input signal F1 and the second input signal F2. For different error specifications, the count can be changed of the CLEAR signal can be at a different time frame.

Figure 2:
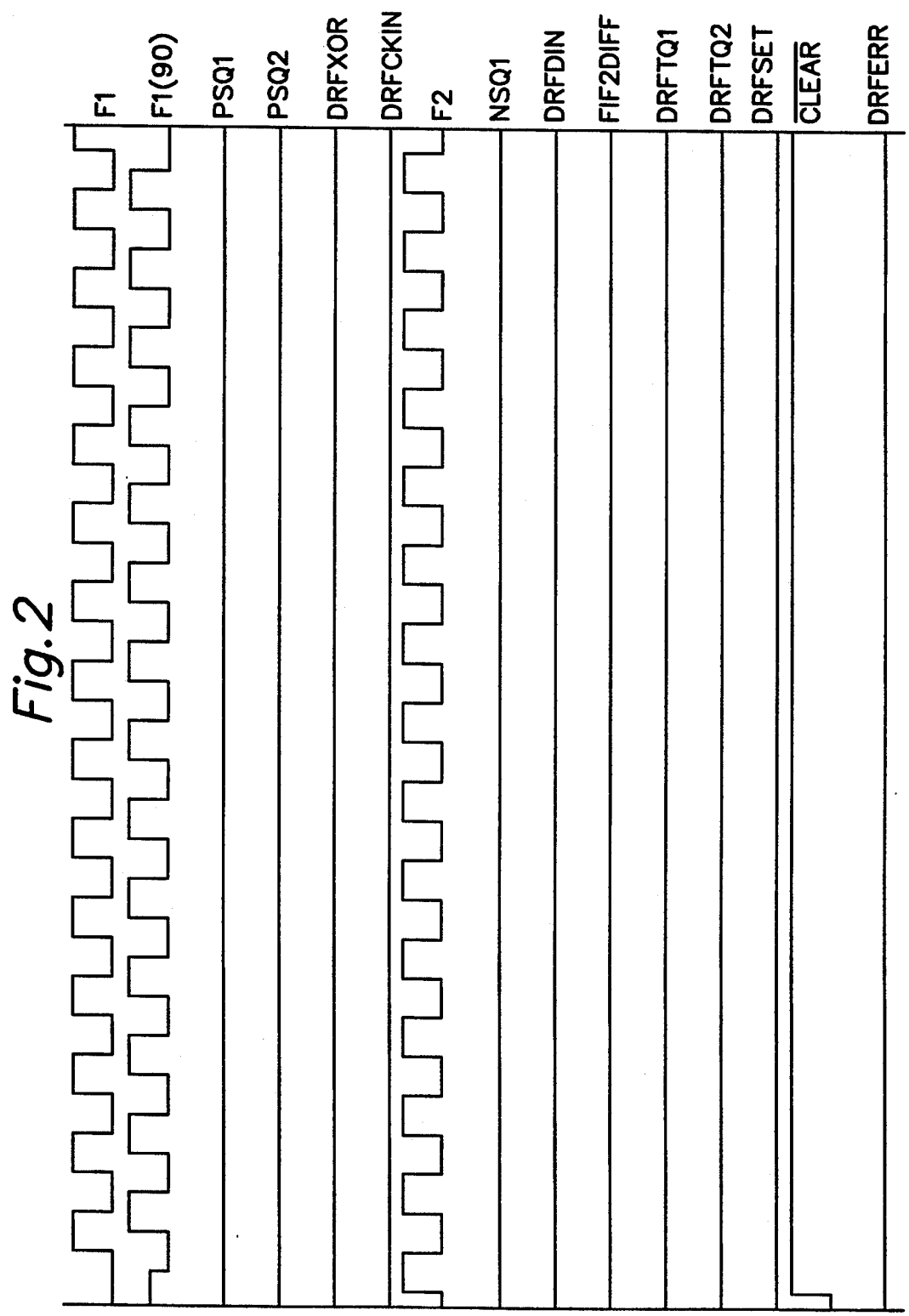
FIG. 2 shows a timing diagram of the operation of the apparatus of FIG. 1 in which the frequencies being supplied are equal.

Referring to FIG. 2 there is shown a sample timing diagram of the operation of the apparatus of FIG. 1 in which the frequencies being supplied are equal. The figure shows F1 and F2 being out of phase. Since the frequencies are equal the phase relationship is maintained throughout a time interval. Thus, the output of the exclusive OR DRFXOR remains at a constant zero value since the PSQ1 and PSQ2 input signals to the exclusive OR 125 is always maintained at a zero. As a result the output signal DRFCKIN is always zero thereby not providing a clocking signal for the sample flip flop 140, resulting in the output signal F1F2DIFF remaining at a zero. F1F2DIFF being at a zero indicates a zero difference between F1 and F2 signals.

Figure 3:
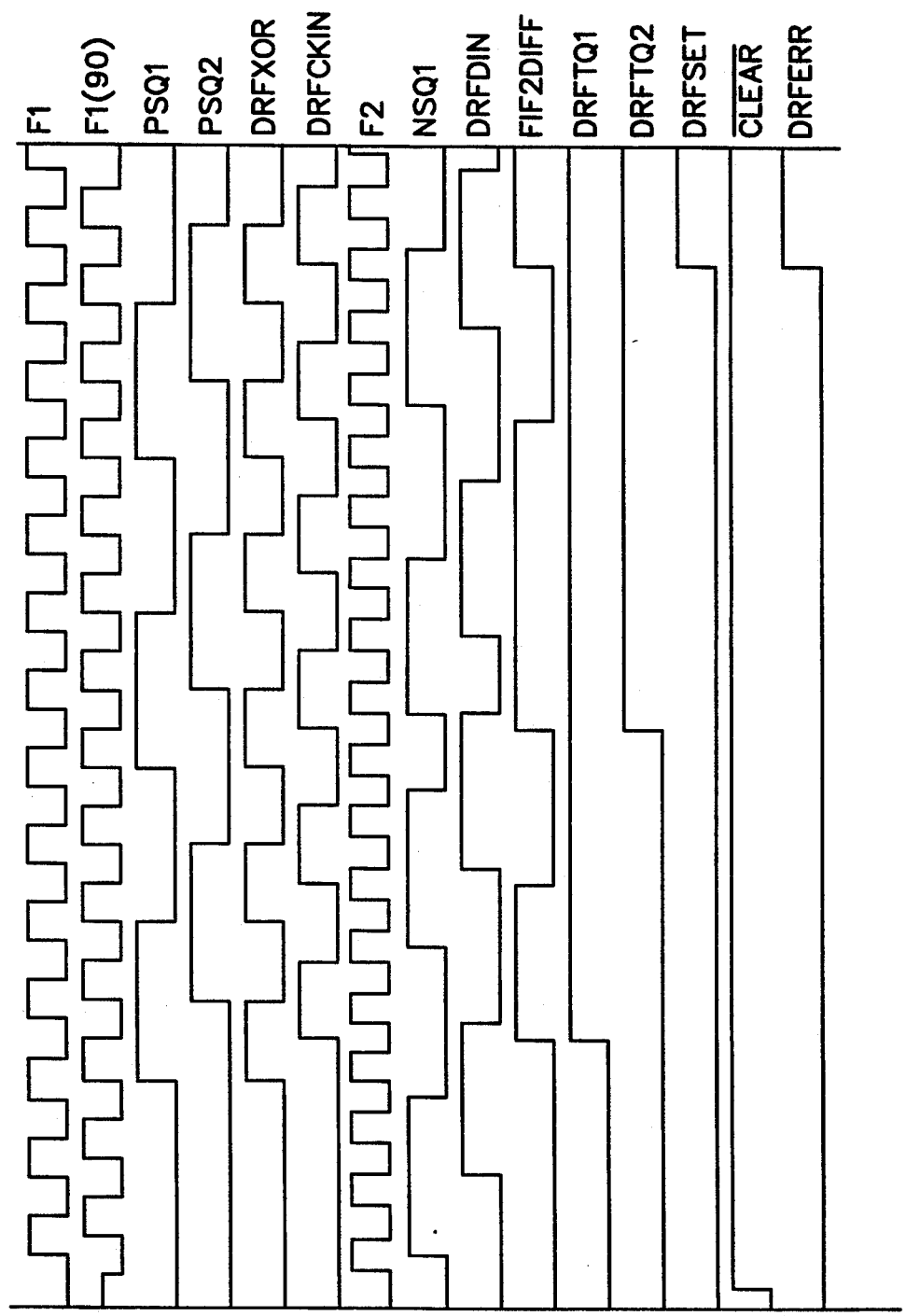
FIG. 3 shows a timing diagram of the apparatus of FIG. 1 in which the frequencies being supplied to the apparatus of FIG. 1 have a difference.

Referring to FIG. 3 there is shown a sample timing diagram of the apparatus of FIG. 1 in which the input frequencies F1 and F2 being supplied to the apparatus 100 have a difference. In this instance there will be a point in time when the F2 signal is high when the F1 (90) signal also goes high thereby clocking the first D-type flip flop 110 PSQ1 goes high and stays high some number of switching of F2 until a point in time when the clocking signal F (90) transitions again in a manner to clock the flip flop 110 and F2 is now at a low thereby causing the PSQ1 signal to go low. This occurs at intervals and results in the PSQ1 signal and PSQ2 signal as shown in the figure. This combination results in an output of the exclusive OR gate 125 DRFXOR and also the output of the edge detect flip flop 130 DRFCKIN. This signal is provided to the sample flip flop 140 and causes the sample flip flop to be clocked, i.e., sample DRFDIN input. This results in the F1F2DIFF signal not being zero but having some difference, the difference being clocked into the counter 150 and results in the various outputs DRFTQ1, DRFTQ2, and DRFSET, for the flip flops 151, 152, 153, respectfully, of the counter 150 as shown in the figure. Once DRFSET is set the maximum count is exceeded resulting in the error signal DRFERR.

Figure 4:
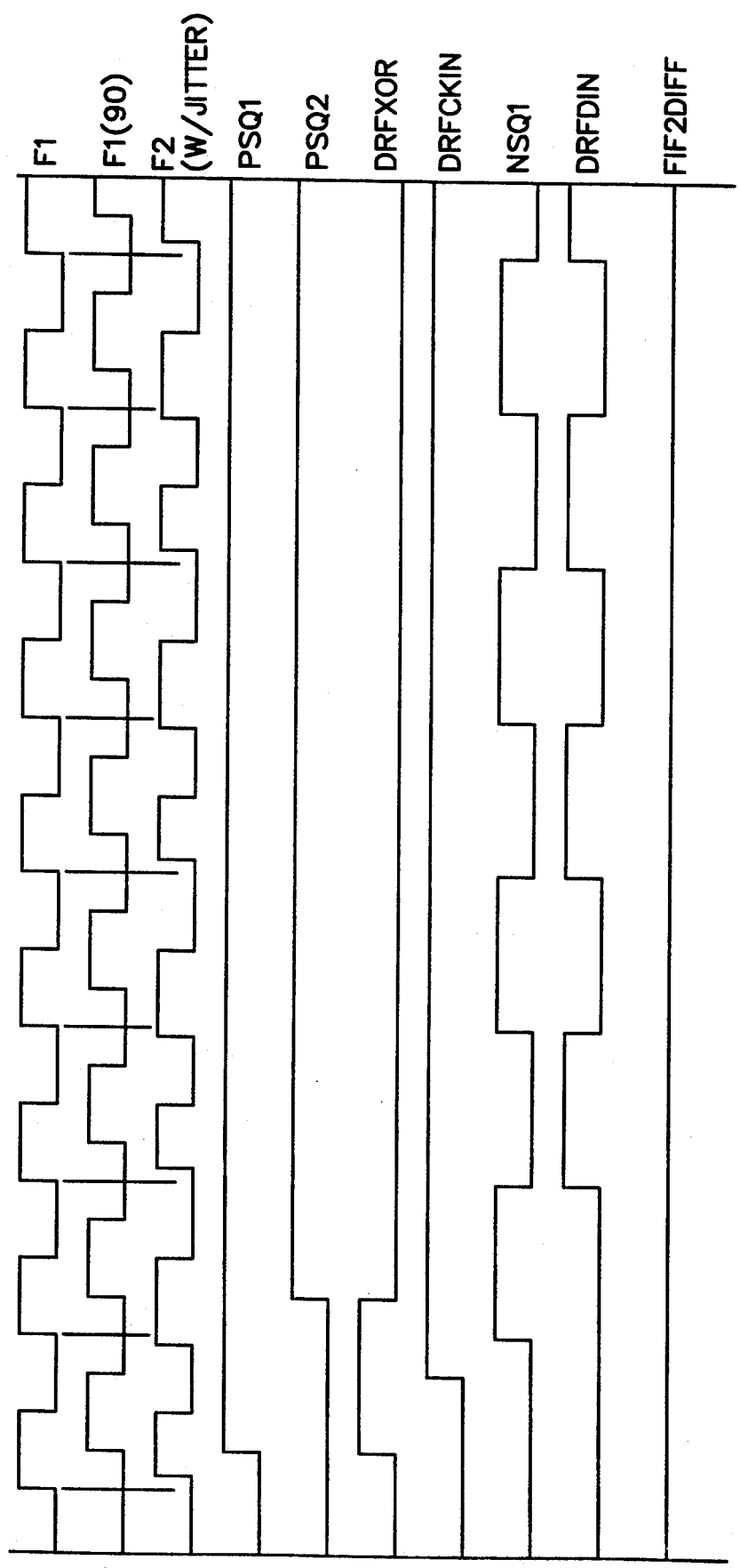
FIG. 4 shows a timing diagram of the apparatus of FIG. 1 wherein the frequencies being supplied to the apparatus of the present invention are equal but there exists jitter between the two signals.

Referring to FIG. 4, there is shown a sample timing diagram of the apparatus of FIG. 1 wherein the frequencies being applied to the apparatus 100 of the present invention are equal but there exists jitter between the two signals F1 and F2. Even though the jitter exists, the PSQ1 and PSQ2 remain the same, that is high, resulting in the output of the X-OR gate 125 being held at a low. The signal DRFCKIN which provides the clock signal for sampling the data in the sample flip flop 140 is maintained at a high and therefore does not cause any output of the sample flip flop 140, i.e., there is no difference detected by the sample flip flop resulting in F1F2DIFF, the difference signal, being held zero. Thus no count is generated by the counter and no error signal occurs.

While there has been shown what is considered the preferred embodiment of the present invention, it will be manifest that many changes and modifications can be made therein without departing from the essential spirit and scope of the invention. It is intended, therefore, in the annexed claims to cover all such changes and modifications which fall within the true scope of the invention.

I claim:

1. An apparatus for detecting a difference of frequency between a first signal having a first frequency and a second signal having a second frequency, said first signal and said second signal being digital signals, said apparatus comprising:

a) phase shift means, for shifting the first signal a predetermined quantity phase-wise, such that the first signal and the shifted first signal are sufficiently out of phase with each other where in the rising and falling edges of each of said first signal and said shifted first signal do not occur at essentially the same time thereby avoiding subsequent simultaneous triggering conditions and jitter conditions between the first and second signals;

b) first gate means, having first and second input terminals, said first input terminal adapted to receive said second signal and said second input terminal coupled to said phase shift means to receive said shifted first signal, for sampling the second signal by the shifted first signal at predetermined times to output a first sampled signal, said first gate means being a double ranked D-type flip flop arrangement;

c) second gate means, having first and second input terminals, said first input terminal of the second gate means adapted to receive said second signal and said second input terminal of said second gate means adapted to receive said first signal, for sampling the second signal by the first signal at predetermined times to output a second sampled signal;

d) sample gate means, having first and second input terminals, the first input terminal of said sample gate means coupled to said second gate means to receive the second sampled signal and the second input terminal of said sample gate mans coupled to said first gate means to receive the first sampled signal, for sampling the first sampled signal and the second sampled signal to generate a difference signal, the difference signal containing a difference value of the frequency difference between the first signal and the second signal; and e) edge detection means, interposed between said first gate means and sad second terminal of said sample gate means, for detecting rising and falling edges between the shifted first signal and second signal, to output the first sampled signal having clean sharp edges.

2. An apparatus for detecting a difference of frequency according to claim 1 wherein said second gate means comprises a double ranked D-type flip flop arrangement.

3. An apparatus for detecting a difference of frequency according to claim 2, wherein said sample gate means comprises a D-type flip flop.

4. An apparatus for detecting a difference of frequency according to claim 3, wherein said edge detector means comprises an exclusive OR gate, a first input to the exclusive OR gate being an output of a first flip flop of the double ranked D-type flip flop arrangement of the first gate means and a second input to the exclusive OR gate being an output of a second flip flop of the double ranked D-type flip flop arrangement of the first gate means.

5. An apparatus for detecting a difference of frequency according to claim 4, wherein said edge detector means further comprises a D-type flip flop coupled to an output of the exclusive OR gate and clocked by said shifted first signal, the output of the D-type flip flop of said edge detector means being the first sample signal having clean sharp edges.

* * * * *